United States Patent [19]
Huh

[11] Patent Number: 5,718,990
[45] Date of Patent: Feb. 17, 1998

[54] SEMICONDUCTOR MASK AND METHOD OF MANUFACTURING THE SAME

[75] Inventor: Hoon Huh, Seoul, Rep. of Korea

[73] Assignee: LG Semicon Co., Ltd., Cheongju, Rep. of Korea

[21] Appl. No.: 495,247

[22] Filed: Jun. 27, 1995

[51] Int. Cl.$^6$ .................................................. G03F 9/00
[52] U.S. Cl. ................................ 430/5; 430/24; 430/313; 430/321
[58] Field of Search ..................... 430/5, 24, 321, 430/312, 313

[56] References Cited

U.S. PATENT DOCUMENTS 5,376,483  12/1994  Rolfson ........................................ 430/5

*Primary Examiner*—Thorl Chea
*Attorney, Agent, or Firm*—Alan R. Loudermilk

[57] ABSTRACT

A mask and method of manufacturing is disclosed. The mask may include a transparent quartz substrate having light-transmitting regions and light-shielding regions, a light-control layer formed on the substrate excluding a portion corresponding to a light-transmitting region of an edge portion, and a light-shielding layer formed on the light-control layer of an light-shielding region. The method may include the steps of preparing a quartz substrate, forming a light-control layer on the quartz substrate, forming a light-shielding layer on the light-shielding region of the light-control layer, and selectively etching the light-control layer corresponding to light-transmitting regions of an edge portion of the substrate.

20 Claims, 7 Drawing Sheets

SEMICONDUCTOR MASK AND METHOD OF MANUFACTURING THE SAME

FIELD OF THE INVENTION

The present invention relates to semiconductor masks, and more particularly to a mask add a method of manufacturing the same, which can improve the profile of a photosensitive pattern at its edges by minimizing the proximity effect in forming a fine pattern.

BACKGROUND OF THE INVENTION

In general, a mask used in a semiconductor device manufacturing process is produced by selectively forming a chrome (Cr) thin film on a quartz substrate of high light-transmissivity. FIGS. 1A to 1D are cross-sectional views illustrating a method of manufacturing a conventional mask.

As illustrated in FIG. 1A, transparent quartz substrate 10 is prepared, and chrome thin film 11 is deposited on the entire surface of prepared quartz substrate 10 as illustrated in FIG. 1B. Thereafter, as illustrated in FIG. 1C, photosensitive film 13 is formed on chrome thin film 11 corresponding to light-shielding regions S, and chrome thin film 11 corresponding to light-transmitting regions T is exposed.

As illustrated in FIG. 1D, chrome thin film 11 is etched by using photosensitive film 13 as a mask, thereby forming light-shielding layer 12. At this time, chrome thin film 11 corresponding to light-transmitting regions T is etched, thereby exposing transparent substrate 10 and forming light-shielding layer 12 in a portion corresponding to light-shielding regions S. As a result, conventional mask 20 of a reticle shape is obtained.

FIG. 2A illustrates the cross-sectional structure of mask 20 manufactured in accordance with the manufacturing method of FIG. 1. FIG. 2B is a diagram illustrating the intensity of light incident upon a wafer through mask 20 of FIG. 2A.

Due to the diffraction of light itself, the light incident upon the wafer through mask 20 exhibits an intensity difference of $\Delta$ (delta) I between light transmitted through light-transmitting region Tc of the center portion of mask 20 and light transmitted through light-transmitting region Te of the edge portion of mask 20. With the photosensitive film on the wafer exposed and developed using conventional mask 20, the light intensity difference of $\Delta$ (delta) I is generated between the center portion and edge portion of mask 20. Thus, the profile of the photosensitive film is obtained as shown in FIG. 3.

Since the profile of the photosensitive film exhibits a difference, as shown in FIG. 3, between the edge portion and center portion, the photosensitive film obtained after exposure and development becomes poor in the edge portion, as the pattern size of the photosensitive film becomes smaller.

SUMMARY OF THE INVENTION

In order to solve the aforementioned problems of the conventional method, it is an object of the present invention to provide a method of manufacturing a semiconductor mask which can prevent poor patterns from being formed in the edge portion of a photosensitive film, by decreasing the intensity of light incident upon the center portion so as to be substantially the same as that of light incident upon the edge portion of the mask.

To accomplish the objects of the present invention, there is provided a semiconductor mask comprising a transparent quartz substrate divided into a light-transmitting region and a light-shielding region, a light-control layer formed on the substrate excluding a portion corresponding to the light-transmitting region of the edge portion, and a light-shielding layer formed on the light-control layer of the light-shielding region. Also, there is provided a method of manufacturing a semiconductor mask, comprising the steps of preparing a quartz substrate, forming a light-control layer on the prepared quartz substrate, forming a light-shielding layer on the light-shielding region of the light-control layer, and selectively etching the light-control layer corresponding to the transmitting region of the edge portion of the substrate.

The light-control layer may be formed so as to have an uniform thickness from the center portion to the transmitting region of the edge portion. Alternatively, the light-control layer may be formed such that it gradually becomes thicker from the edge portion to the center portion.

BRIEF DESCRIPTION OF THE ATTACHED DRAWINGS

DETAILED DESCRIPTION OF THE INVENTION

Hereinafter, preferred embodiments of the present invention including a method of manufacturing a mask according to the present invention will be described with reference to the attached drawings.

FIGS. 4A to 4G are cross-sectional views illustrating a first embodiment of a method of manufacturing a mask according to the present invention.

Figure 1A:
FIGS. 1A to 1D are cross-sectional views illustrating a method of manufacturing a conventional semiconductor mask.
Figure 1B:
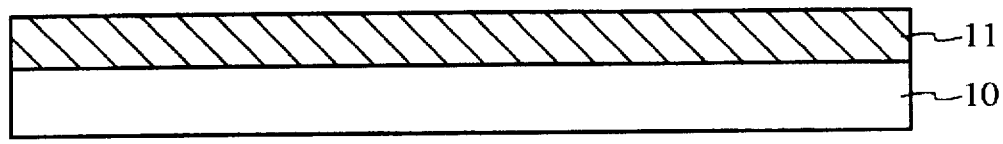
Figure 1C:
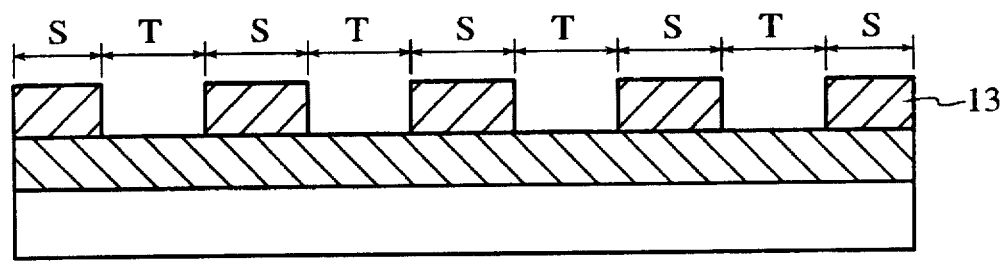
Figure 1D:
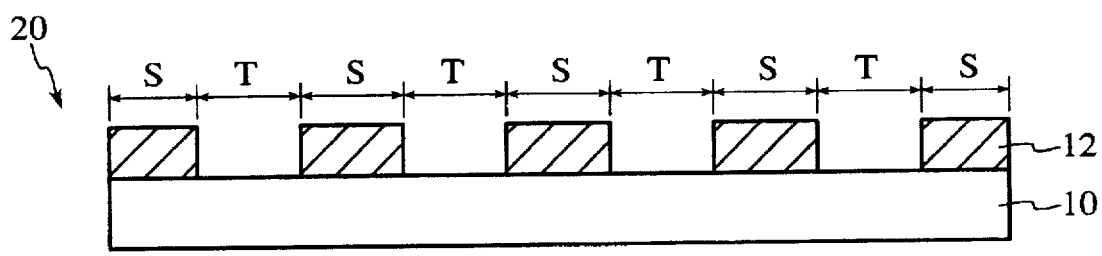
Figure 2A:
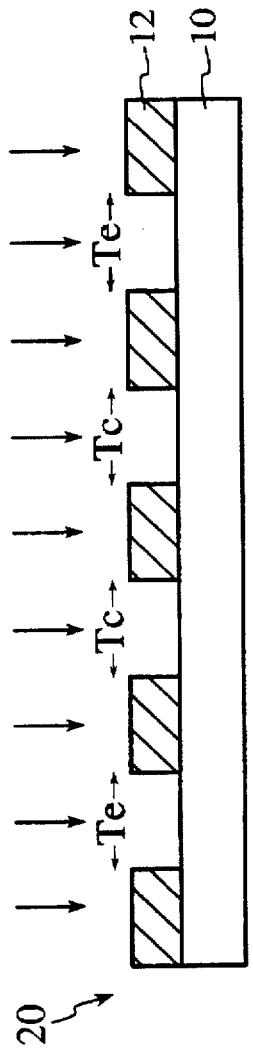
FIG. 2A is a cross-sectional view illustrating the structure of a conventional shift mask.
Figure 2B:
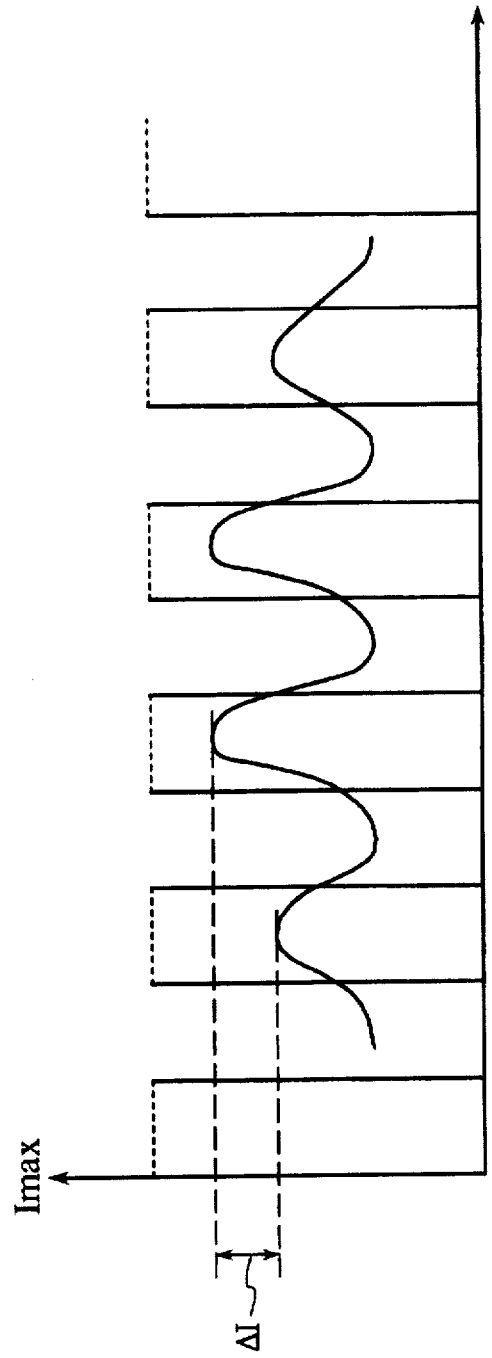
FIG. 2B is a diagram illustrating the intensity of light incident upon a wafer through the semiconductor mask of FIG. 2A.
Figure 3:
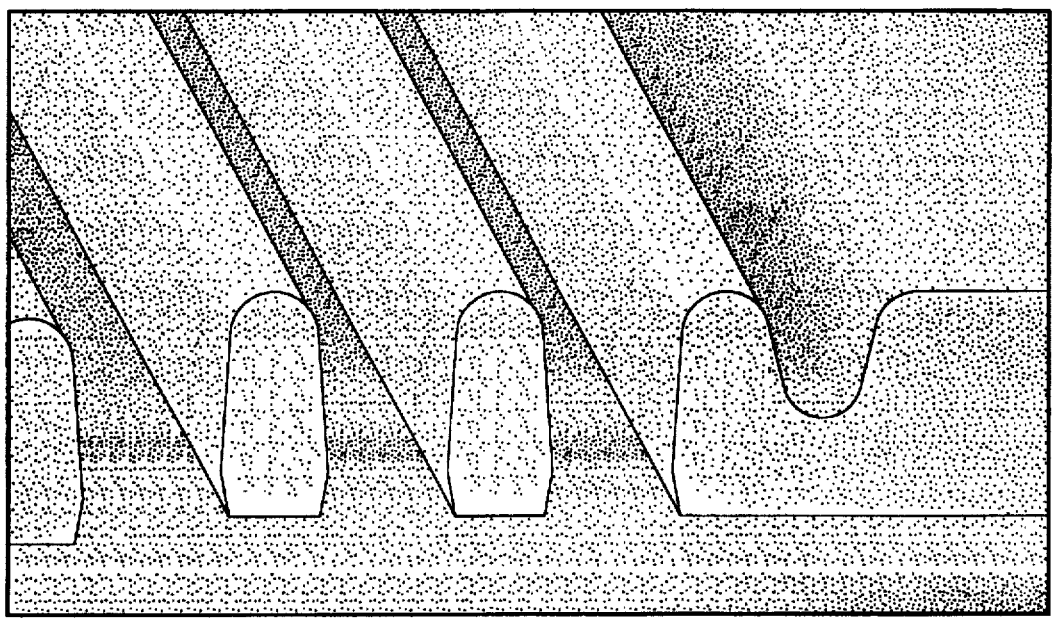
FIG. 3 is a scanned electron microscopy (SEM) analysis photograph showing a photosensitive film patterned using the semiconductor mask of FIG. 2A.
Figure 4A:
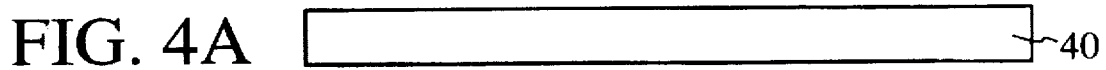
FIGS. 4A to 4G are cross-sectional views illustrating a method of manufacturing a semiconductor mask according to a first embodiment of the present invention.
Figure 4B:
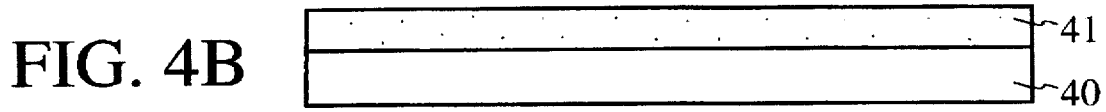
Figure 4C:
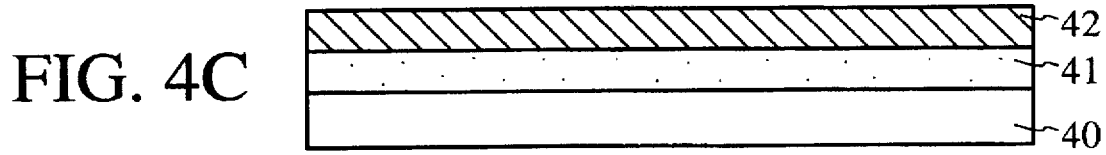

As illustrated in FIG. 4A, quartz substrate 40 is prepared. Transparency light-control layer 41 is formed on prepared quartz substrate 40, as illustrated in FIG. 4B. As illustrated in FIG. 4C, chrome thin film 42 is formed on transparency light-control layer 41.

Transparency light-control layer 41 serves to control the transmissivity of incident light. A material having a lower light transmissivity than that of quartz substrate 40, which has excellent light-transmissivity, is used as a material constituting transparency light-control layer 41. For transparency light-control layer 41, a polyimide containing a dye, or an inorganic layer such as an oxide film or a nitride film may be used.

Figure 4D:
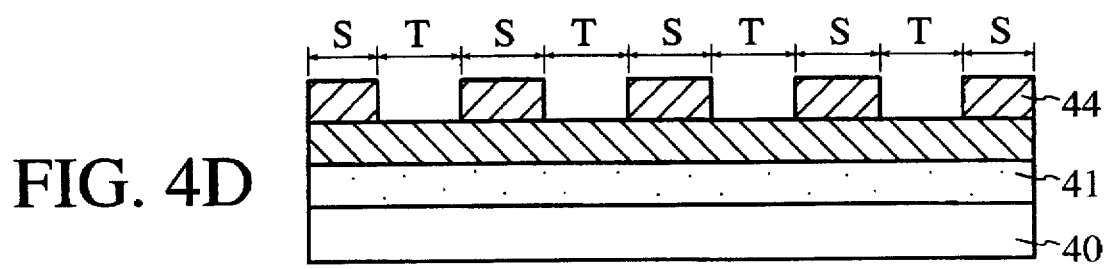
Figure 4E:
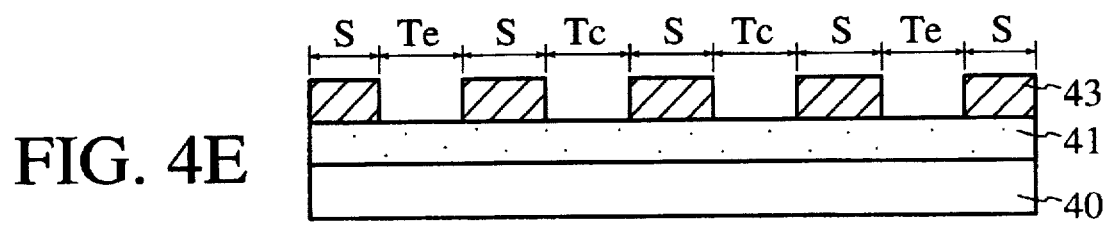

As illustrated in FIG. 4D, photosensitive film 44 is coated on chrome thin film 42 and patterned, thereby defining light-transmitting regions T and light-shielding regions S. Chrome thin film 42 on light-transmitting regions T is selectively etched using photosensitive film 44 as a mask, thereby forming light-shielding layer 43 on light-shielding regions S, as illustrated in FIG. 4E.

Figure 4F:
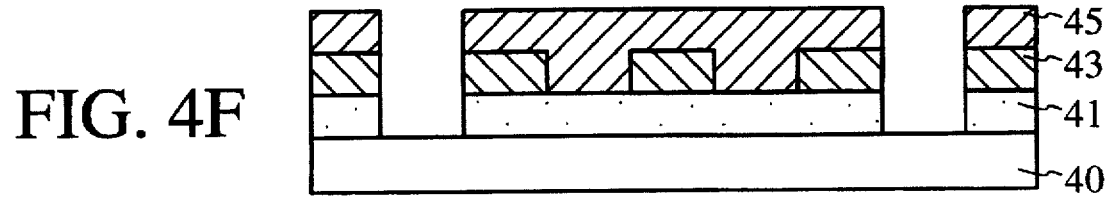
Figure 4G:
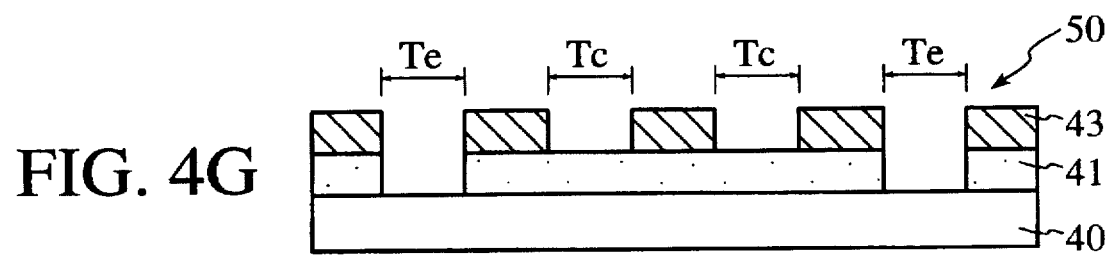

As illustrated in FIG. 4F, photosensitive film 45 is coated on the exposed portions of transparency light-control layer 41 and light-shielding layer 41 and then patterned, thereby exposing transparency light control layer 41 in light-transmitting region Te of the edge portion of light-transmitting region T. As illustrated in FIG. 4G, exposed transparency light-control layer 41 in light-transmitting region Te of the edge portion of light-transmitting region T is selectively etched using photosensitive film 45 as a mask, with photosensitive film 45 thereafter removed. In a light-transmitting region Tc of the center portion of the mask, transparency light-control layer 41 remains on the substrate. In a light-transmitting region Te of the edge portion, transparency light-control layer 41 is removed, thereby exposing transparent quartz substrate 40. As a result, semiconductor mask 50 according to the first embodiment is obtained.

Figure 5A:
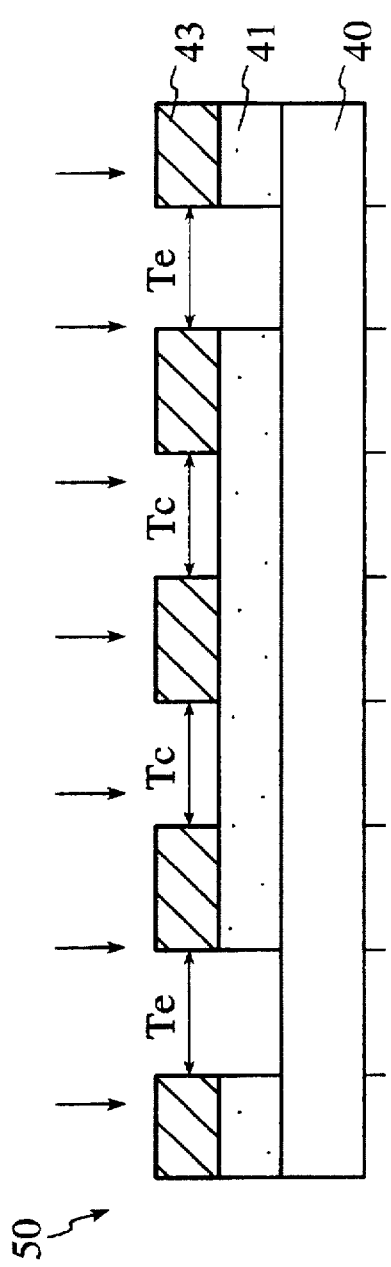
FIG. 5A is a cross-sectional view illustrating the structure of a semiconductor mask according to the first embodiment of the present invention.
Figure 5B:
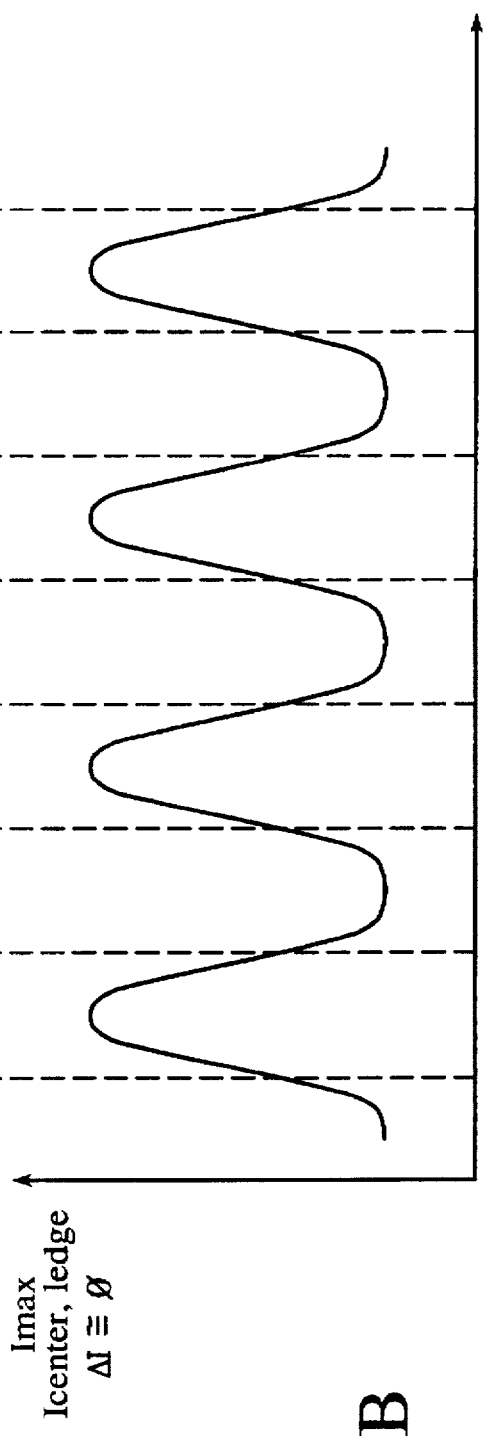
FIG. 5B is a diagram illustrating the intensity of light incident upon a wafer through the semiconductor mask of FIG. 5A.

FIG. 5A is a cross-sectional view illustrating the structure of semiconductor mask 50 according to the first embodiment. FIG. 5B is a diagram illustrating the intensity of light incident upon a wafer through semiconductor mask 50 of FIG. 5A.

In light-transmitting region Te of the edge portion of semiconductor mask 50, incident light is transmitted through exposed transparent substrate 40 and is incident upon a wafer. In the light-transmitting region Tc of the center portion, incident light is transmitted through transparency light-control layer 41 and is incident upon the wafer.

Accordingly, in the light-transmitting region Te of the edge portion, light is transmitted intact through transparent quartz substrate 40 (i.e., without passing through transparency light-control layer 41). In light-transmitting region Tc of the center portion, light is transmitted through transparency light-control layer 41 having a light-transmissivity lower than that of transparent quartz substrate 40. Thus, the intensity of light incident upon the wafer through transparency light-control layer 41 is decreased as compared with that of light incident through the quartz substrate in the center region. Therefore, the intensity of light incident upon the wafer through entire light-transmitting region T of mask 50 becomes more uniform.

FIGS. 6A to 6H are cross-sectional views illustrating a second embodiment of a method of manufacturing a semiconductor mask according to the present invention.

Figure 6A:
FIGS. 6A to 6H are cross-sectional views illustrating a method of manufacturing a semiconductor mask according to a second embodiment of the present invention.
Figure 6B:
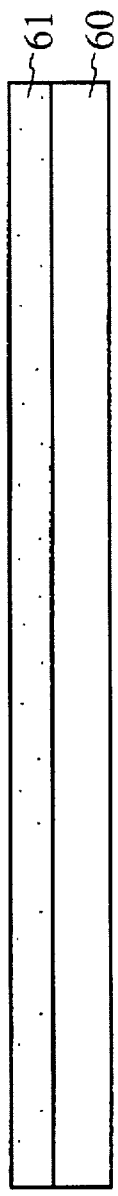

As illustrated in FIG. 6A, quartz substrate 60 is prepared. Transparency light-control layer 61 is formed on prepared quartz substrate 60, as illustrated in FIG. 6B. Transparency light-control layer 61 serves to control light, as in the first embodiment. A material which can suppress light-transmissivity to a greater degree than quartz substrate 60 can be used as a material constituting transparency light-control layer 61.

Figure 6C:
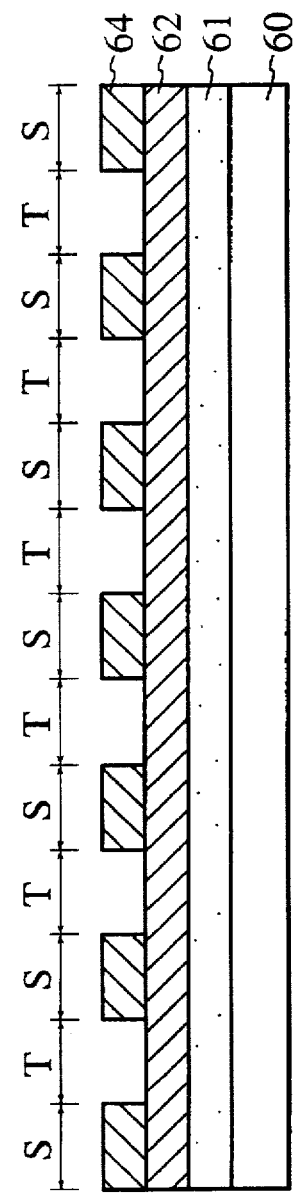

As illustrated in FIG. 6C, chrome thin film 62 is formed on transparency light-control layer 61 and photosensitive film 64 is coated on chrome thin film 62. Photosensitive film 62 is patterned to form light-transmitting regions T and light-shielding regions S.

Figure 6D:
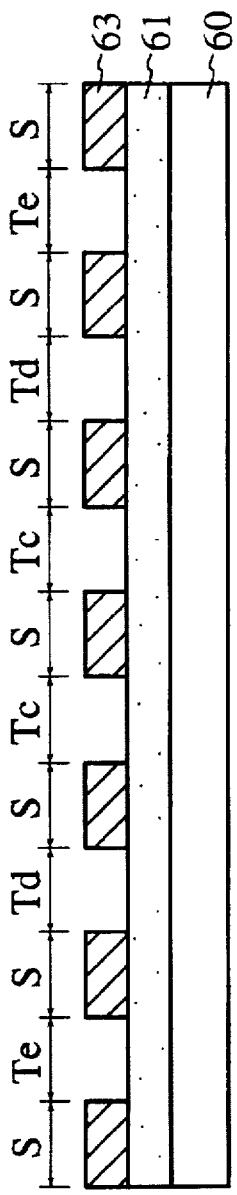

As illustrated in FIG. 6D, chrome thin film 62 is selectively etched using photosensitive film 64 as a mask, thereby forming light-shielding layer 63 on light-shielding regions S and exposing transparency light-control layer 61 of light-transmitting region T.

Figure 6E:
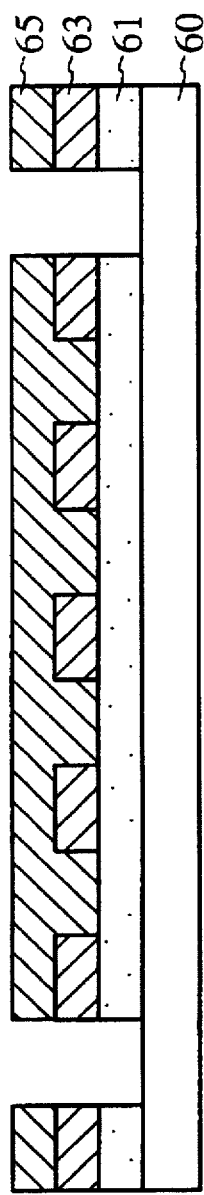
Figure 6F:
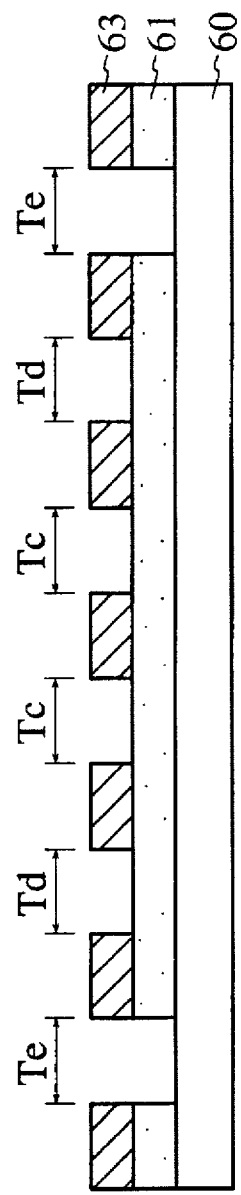

As illustrated in FIG. 6E, photosensitive film 65 is coated on the exposed portions of transparency light-control layer 61 and light-shielding layer 43 and then patterned, thereby exposing transparency light-control layer 61 in light transmitting region Te of the edge portion of light-transmitting region T. As illustrated in FIG. 6F, exposed transparency light-control layer 61 in light-transmitting region Te of the edge portion of light-transmitting region T is selectively etched using photosensitive film 65 as a mask, thereby exposing substrate 60 corresponding to the light-transmitting region Te of the edge portion, with photosensitive film 65 thereafter removed.

Figure 6G:
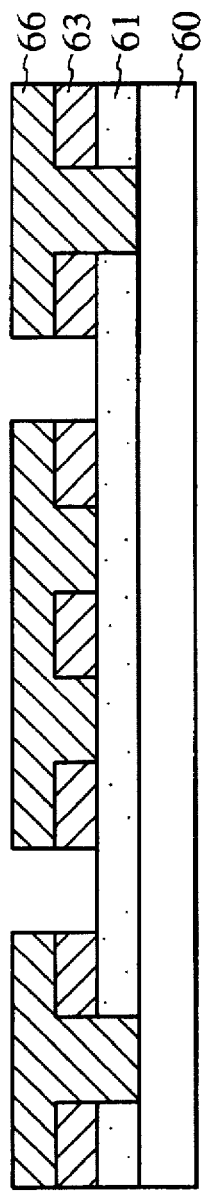
Figure 6H:
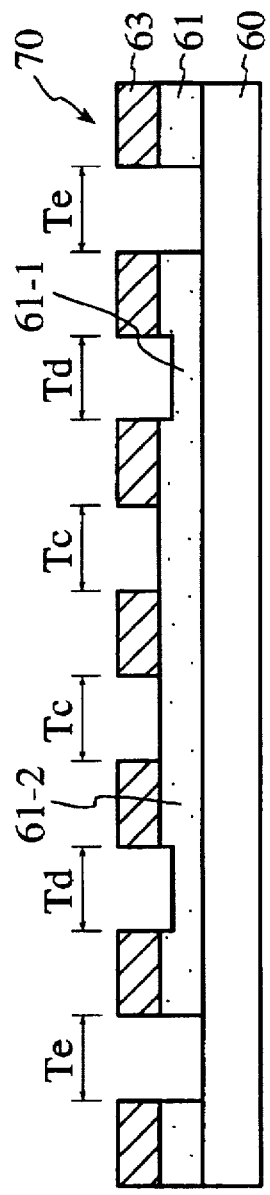

As illustrated in FIG. 6G, photosensitive film 66 is coated on the exposed portions of transparency light-control layer 61, light-shielding layer 63 and substrate 60 and then patterned, thereby exposing transparency light-control layer 61 in light-transmitting region Td between the center portion Tc and edge portion Te of light-transmitting region T. As illustrated in FIG. 6H, exposed transparency light-control layer 61 is etched to a predetermined thickness (i.e., etched partially to a desired depth) using photosensitive film 66 as a mask.

Transparency light-control layer 61 in light-transmitting region Td between edge portion Te and central portion Tc is not entirely etched, but instead is partially etched to a predetermined, desired thickness so that light is transmitted to a greater degree in light-transmitting region Td than in light-transmitting region Tc, while light is transmitted to a lesser degree in light-transmitting region Td than in light-transmitting region Te. As a result, semiconductor mask 70 according to the second embodiment is obtained.

In semiconductor mask 70 according to the second embodiment, transparency light-control layer 61 may be fully removed so that light is completely transmitted through the light-transmitting region Te of the edge portion, thereby exposing quartz substrate 60. In light-transmitting region Tc of the center portion, transparency light-control layer 61 is not etched and remains intact so that light is transmitted less in light-transmitting region Tc than in light-transmitting region Te of the edge portion. Further, in light-transmitting region Td between the edge portion and center portion, for transmitting light less in light-transmitting region Td than in light-transmitting region Te of the edge portion and for transmitting light more in light-transmitting region Td than in light-transmitting region Tc of the center portion, transparency lightcontrol layer 61 is formed to have a thickness thinner than that of the center portion.

In FIG. 6H, an etching process is performed once, thereby forming transparency light-control layer 61 such that transparency light-control layer 61-1 of light-transmitting region Td between the center portion and edge portion has a thickness that is thinner than that of transparency light-control layer 61-2 of light-transmitting region Tc of the center portion. Alternatively, an etching process may be performed a number of times, so that transparency light-control layer 61 may be formed such that it gradually becomes thinner moving from the center portion towards the edge portion. In other words, a number of etching processes may be performed, thereby forming a number of "steps" of decreasing thickness of transparency light-control layer 61, with the thicker portions nearer the center regions and the thinner portions nearer the edge regions, with greater uniformity of incident light being achieved.

According to the present invention as described above, in the light-transmitting region of the center portion of a semiconductor mask, a transparency light-control layer having a light-transmissivity lower than that of a transparent quartz substrate is formed, so that light-transmissivity can be controlled in the light-transmitting region of the center portion, with the thickness of the light-control layer selected based on the materials chosen and the degree of light-tansmissivity reduction required to achieve uniformity. Therefore, in case a semiconductor mask of the present invention is used for forming a fine pattern, the proximity effect can be minimized. As a result, the profile of a photosensitive film in the edge portion, which can become a problem with the conventional semiconductor mask, is improved. Thus, the generation of poor patterns may be prevented.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A mask comprising:
   a transparent substrate having a central portion and an edge portion;
   a light-control layer on the substrate; and
   a light-shielding pattern on the light-control layer;
   wherein, the center portion comprises the light shielding pattern defines light-shielding regions and light-transmitting regions, and the edge portion comprises a light-transmitting region; wherein the light control layer is not present in the light-transmitting region in the edge portion.

2. A mask as claimed in claim 1, wherein the transparent substrate comprises quartz.

3. A mask as claimed in claim 2, wherein the light-control layer comprises a material having a light-transmissivity lower than the light-transmissivity of the quartz substrate.

4. A mask as claimed in claim 3, wherein the light-control layer comprises a material selected from the group of a polyimide containing a dye or an inorganic layer, wherein the inorganic layer comprises an oxide film or a nitride film.

5. A mask comprising:
   a transparent substrate having a central portion and an edge portion;
   a light-control layer on the substrate; and
   a light-shielding pattern on the light-control layer;
   wherein, the central portion comprises the light shielding pattern defines light-shielding regions and light-transmitting regions, and the edge portion comprises light-transmitting region; wherein the light control layer has a thickness in the light-transmitting region in the edge portion thinner than a thickness of the light control layer in the light-transmitting region in the central portion.

6. A mask as claimed in claim 5, wherein the transparent substrate comprises quartz.

7. A mask as claimed in claim 5, wherein the light-control layer gradually becomes thinner in a direction extending from the light-transmitting region in the central portion to the light-transmitting region in the edge portion.

8. A method of manufacturing a mask, comprising the steps of:
   preparing a substrate having an edge portion and a central portion;
   forming a light-control layer on the substrate;
   selectively forming a light-shielding layer on the light-control layer; wherein the light-shielding layer defines light-shielding regions and light-transmitting regions and; the edge portion comprises light-transmitting region; and
   selectively removing a portion of the light-control layer in a light-transmitting region in the edge portion.

9. A method of manufacturing a mask as claimed in claim 8, wherein the substrate comprises quartz.

10. A method of manufacturing a mask as claimed in claim 9, wherein the light-control layer comprises a material having a light-transmissivity lower than that of the quartz substrate.

11. A method of manufacturing a mask as claimed in claim 10, wherein the light-control layer comprises a material selected from the group of a polyimide containing a dye or an inorganic layer, wherein the inorganic layer comprises an oxide film or a nitride film.

12. A method of manufacturing a mask as claimed in claim 8, wherein the step of selectively forming a light-shielding layer on the light-control layer comprises the steps of:
   forming a chrome layer on the light-control layer;
   defining the chrome layer into light-shielding regions and light-transmitting regions; and
   removing the chrome layer in the light-transmitting regions.

13. A method of manufacturing a mask, comprising the steps of:
   preparing a substrate having an edge portion and a central therein portion;
   forming a light-control layer on the substrate;
   selectively forming a light-shielding layer on the light-control layer; wherein the central portion comprises the light-shielding layer defines light-shielding regions and light-transmitting regions, the edge portion comprises light-transmitting region; and
   selectively removing a portion of the light-control layer in a light-transmitting region in the edge portion; wherein the light-control layer has a thickness in a light-transmitting region in the central portion greater than the thickness in the light-transmitting region in the edge portion.

14. A method of manufacturing a mask as claimed in claim 13, wherein the light-control layer gradually becomes thinner in a direction extending from the light-transmitting region in the central portion to the light-transmitting region in the edge portion.

15. A method of manufacturing a mask as claimed in claim 13, wherein the substrate comprises quartz.

16. A method of manufacturing a mask as claimed in claim 15, wherein the light-control layer comprises a material having a light-transmissivity lower than that of the quartz substrate.

17. A method of manufacturing a mask as claimed in claim 16, wherein the light-control layer comprises a material selected from the group of a polyimide containing a dye or an inorganic layer, wherein the inorganic layer comprises an oxide film or a nitride film.

18. A method of manufacturing a mask as claimed in claim 8, wherein the step of selectively forming a light-shielding layer on the light-control layer comprises the steps of:
   forming a chrome layer on the light-control layer;
   defining the chrome layer into light-shielding regions and light-transmitting regions; and removing the chrome layer in the light-transmitting regions.

19. A method of manufacturing a mask as claimed in claim 13, wherein the step of selectively removing the portion of the light-control layer in the light-transmitting region in the edge portion comprises etching the light-control layer in the light-transmitting region in the edge portion.

20. A method of manufacturing a mask, comprising the steps of:

preparing a substrate having an edge portion and a central portion;

forming a light-control layer on the substrate;

selectively forming a light-shielding layer; wherein the central portion comprises the light-shielding layer defines light-shielding regions and light-transmitting regions on the substrate; the edge portion comprises light-transmitting region;

wherein, the light-control layer has a thickness in the light-transmitting regions of the center portion greater than the thickness in the light-transmitting region of the edge portion.

* * * * *

UNITED STATES PATENT AND TRADEMARK OFFICE
CERTIFICATE OF CORRECTION

PATENT NO. : 5,718,990
DATED : February 17, 1998
INVENTOR(S) : Hoon Huh

It is certified that error appears in the above-identified patent and that said Letters Patent is hereby corrected as shown below:

Column 5, line 28, "center" should be --central--;
Column 5, line 29, after "pattern", insert --which--;
Column 5, line 50, after "pattern", insert --which--;
Column 5, line 51, after "edge portion comprises", insert --a--;
Column 6, line 2, after "wherein", insert --the central portion comprises--;
Column 6, line 2, after "the light-shielding layer", insert --which--;
Column 6, lines 3-4 after "the light-transmitting regions", delete "and";
Column 6, line 4, after "the edge portion comprises", insert --a--;
Column 6, lines 30-31, after "edge portion and central", delete "therein";

UNITED STATES PATENT AND TRADEMARK OFFICE
CERTIFICATE OF CORRECTION

PATENT NO.   : 5,718,990
DATED        : February 17, 1998
INVENTOR(S)  : Hoon Huh It is certified that error appears in the above-indentified patent and that said Letters Patent is hereby corrected as shown below:

Column 6, line 36, after "the light-shielding layer", insert --which--;

Column 6, line 37, after "the edge portion comprises", insert --a--;

Column 8, line 3, after "the light-shielding layer", insert --which--; and

Column 8, line 5, after "the edge portion comprises", insert --a--.

Signed and Sealed this

Twenty-third Day of June, 1998

BRUCE LEHMAN

Attest:

Attesting Officer

Commissioner of Patents and Trademarks